US012591719B2

(12) United States Patent
Bennett et al.

(10) Patent No.: US 12,591,719 B2
(45) Date of Patent: Mar. 31, 2026

(54) COMPUTER SIMULATION ENVIRONMENT WITH OUTPUT MODELS AND INPUT MODELS

(71) Applicant: The Boeing Company, Chicago, IL (US)

(72) Inventors: John M. Bennett, Vashon, WA (US); Josh Christian, Tacoma, WA (US); Gary Mansouri, Bothell, WA (US)

(73) Assignee: The Boeing Company, Arlington, VA (US)

( * ) Notice: Subject to any disclaimer, the term of this patent is extended or adjusted under 35 U.S.C. 154(b) by 1135 days.

(21) Appl. No.: 17/645,417

(22) Filed: Dec. 21, 2021

(65) Prior Publication Data

US 2023/0195960 A1 Jun. 22, 2023

(51) Int. Cl.
G06F 30/20 (2020.01)

(52) U.S. Cl.
CPC .................................... G06F 30/20 (2020.01)

(58) Field of Classification Search
CPC .......... G06F 30/20; G06F 30/25; G06F 30/27; G06F 30/28; G06F 2111/00; G06F 2119/22
See application file for complete search history.

(56) References Cited

U.S. PATENT DOCUMENTS

| | | | | | |
|---|---|---|---|---|---|
| 6,980,530 | B2 * | 12/2005 | Reddy | ................... | H04L 47/623 |
| | | | | | 370/316 |
| 8,601,150 | B1 * | 12/2013 | Portell | ................. | G06F 15/163 |
| | | | | | 709/234 |
| 8,978,002 | B1 * | 3/2015 | Gaurav | ................... | G06F 30/33 |
| | | | | | 716/112 |
| 11,036,546 | B1 * | 6/2021 | Bhandari | ................ | G06F 9/544 |
| 2003/0045298 | A1 * | 3/2003 | Linton | ................ | H04L 43/0888 |
| | | | | | 455/452.1 |
| 2004/0044972 | A1 * | 3/2004 | Rohrbaugh | ............. | G06F 30/33 |
| | | | | | 716/103 |

(Continued)

OTHER PUBLICATIONS

"Functional Mock-up Interface", Available at <<https://fmi-standard.org/>>, Retrieved as early as Oct. 15, 2021, 3 pages.

(Continued)

*Primary Examiner* — Kibrom K Gebresilassie
(74) *Attorney, Agent, or Firm* — Alleman Hall LLP

(57) ABSTRACT

Examples are disclosed relating computer simulation environments that comprise output models producing output data and input models waiting for a portion of output data. One example provides a computing system comprising a scheduler configured to determine if prerequisite data is available for each input model. On condition that the prerequisite data is available, the input model is stepped. The output models and input models are maintained within a predetermined number of steps of each other. A router is configured to, when a selected output model finishes a step, copy the output data from an output buffer of the selected output model and send the output data to an output queue. The output data is stored until a selected input model is ready to step the selected frame. The output data is then copied from the output queue into an input packet buffer of the selected input model.

20 Claims, 12 Drawing Sheets

(56) References Cited

U.S. PATENT DOCUMENTS

2014/0007044 A1* 1/2014 Aliseychik .......... G06F 11/3672
717/106

OTHER PUBLICATIONS

European Patent Office, Extended European Search Report Issued in Application No. 22207534.3, Aug. 28, 2023, Germany, 13 pages.
Mcdonald, N. et al., "SuperSim: Extensible Flit-Level Simulation of Large-Scale Interconnection Networks," Proceedings of the IEEE International Symposium on Performance Analysis of Systems and Software, Apr. 2, 2018, Belfast, UK, 12 pages.
Viskic, I. et al., "Design Exploration and Automatic Generation of MPSoC Platform TLMs from Kahn Process Network Applications," Proceedings of Languages, Compilers, and Tools for Embedded Systems, Apr. 13, 2010, Stockholm, Sweden, 8 pages.
Vrba, Ž. et al., "The Nornir run-time system for parallel programs using Kahn process networks on multi-core machines—a flexible alternative to MapReduce," The Journal of Supercomputing, vol. 63, No. 1, Nov. 13, 2010, 27 pages.

* cited by examiner

Figure 2:
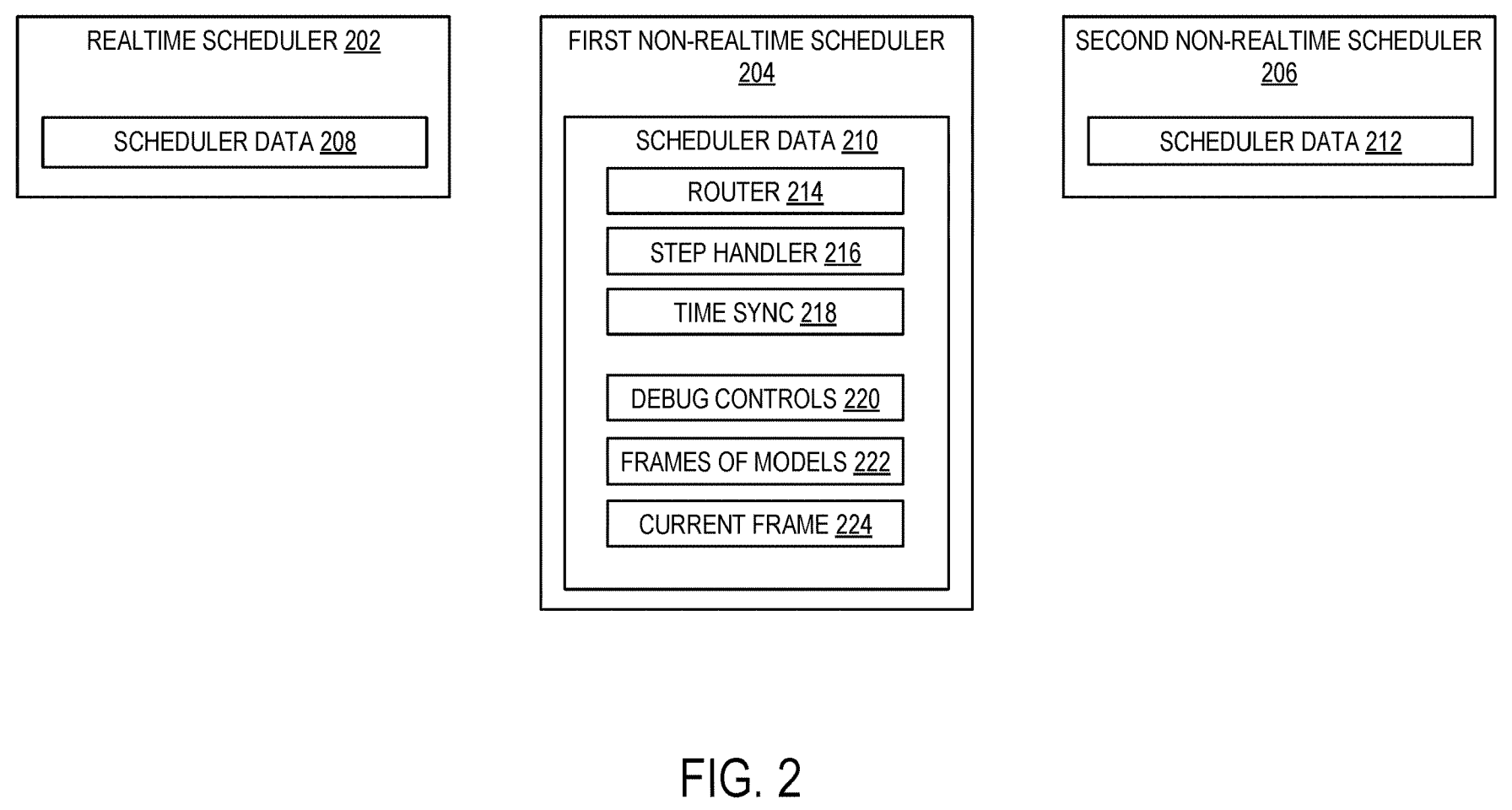

SECOND NON-REALTIME SCHEDULER 206

SCHEDULER DATA 212

FIRST NON-REALTIME SCHEDULER 204

SCHEDULER DATA 210

ROUTER 214

STEP HANDLER 216

TIME SYNC 218

DEBUG CONTROLS 220

FRAMES OF MODELS 222

CURRENT FRAME 224

REALTIME SCHEDULER 202

SCHEDULER DATA 208

DETERMINE IF PREREQUISITE DATA THAT IS NECESSARY FOR THE INPUT MODEL TO STEP A SELECTED FRAME IS AVAILABLE, WHEREIN THE PREREQUISITE DATA COMPRISES SELECTED OUTPUT DATA GENERATED BY ONE OR MORE OUTPUT MODELS OF THE PLURALITY OF OUTPUT MODELS 302

CALCULATE AN OUTPUT FRAME AT WHICH A SELECTED OUTPUT MODEL IS REQUIRED TO BE; AND ON CONDITION THAT THE SELECTED OUTPUT MODEL IS AT THE OUTPUT FRAME, DETERMINING THAT THE PREREQUISITE DATA IS AVAILABLE FOR A SELECTED INPUT MODEL 304

UTILIZE AN INPUT MODEL FRAME RATE OF THE SELECTED INPUT MODEL AND AN OUTPUT MODEL FRAME RATE OF THE SELECTED OUTPUT MODEL 306

DETERMINE WHETHER THE SELECTED INPUT MODEL AND THE SELECTED OUTPUT MODEL ARE IN A SAME SEQUENCE 308

ON CONDITION THAT THE PREREQUISITE DATA IS AVAILABLE FOR THE INPUT MODEL, STEP THE INPUT MODEL 310

MAINTAIN THE PLURALITY OF OUTPUT MODELS AND THE PLURALITY OF INPUT MODELS WITHIN A PREDETERMINED NUMBER OF STEPS OF EACH OTHER 312

WHEN A SELECTED OUTPUT MODEL OF THE PLURALITY OF OUTPUT MODELS FINISHES A STEP, COPY THE OUTPUT DATA FROM AN OUTPUT BUFFER OF THE SELECTED OUTPUT MODEL AND SEND THE OUTPUT DATA TO AN OUTPUT QUEUE, WHEREIN THE OUTPUT DATA COMPRISES AT LEAST A PORTION OF THE PREREQUISITE DATA THAT IS NECESSARY FOR A SELECTED INPUT MODEL OF THE PLURALITY OF INPUT MODELS TO STEP THE SELECTED FRAME; STORE THE OUTPUT DATA IN THE OUTPUT QUEUE UNTIL THE SELECTED INPUT MODEL IS READY TO STEP THE SELECTED FRAME; AND WHEN THE SELECTED INPUT MODEL IS READY TO STEP THE SELECTED FRAME, COPY THE OUTPUT DATA FROM THE OUTPUT QUEUE INTO AN INPUT PACKET BUFFER OF THE SELECTED INPUT MODEL 314

OPERATE ONE OR MORE OUTPUT MODELS OF THE PLURALITY OF OUTPUT MODELS (1) IN PARALLEL WITH ONE OR MORE INPUT MODELS OF THE PLURALITY OF INPUT MODELS AND/OR (2) ASYNCHRONOUSLY AT DIFFERENT FRAME RATES WITH RESPECT TO THE ONE OR MORE INPUT MODELS OF THE PLURALITY OF INPUT MODELS 316

GENERATE DETERMINISTIC RESULTS FROM THE COMPUTER SIMULATION ENVIRONMENT WHILE RUNNING ONE OR MORE OUTPUT MODELS OF THE PLURALITY OF OUTPUT MODELS AND ONE OR MORE INPUT MODELS OF THE PLURALITY OF INPUT MODELS IN PARALLEL CONFIGURATIONS 318

FIG. 3

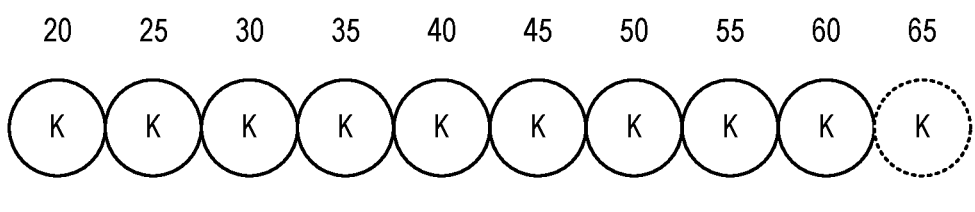
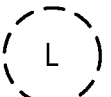
FIG. 8
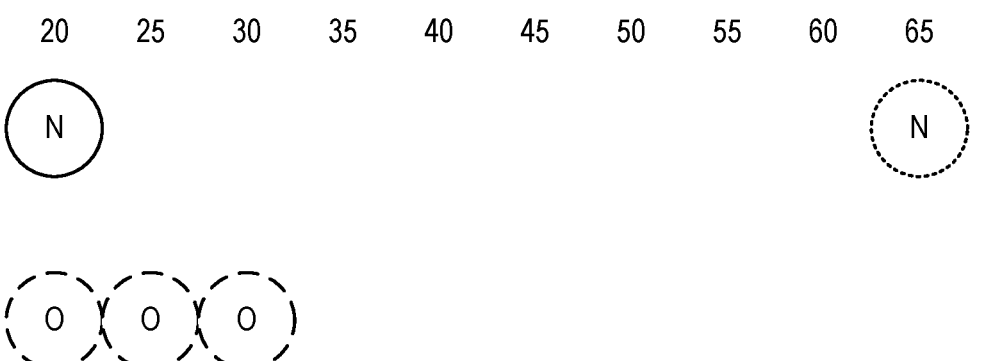
FIG. 9

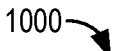

1000

WHEN A SELECTED OUTPUT MODEL OF THE PLURALITY OF OUTPUT MODELS FINISHES A STEP, COPY THE OUTPUT DATA FROM AN OUTPUT BUFFER OF THE SELECTED OUTPUT MODEL AND SEND THE OUTPUT DATA TO AN OUTPUT QUEUE 1002

THE OUTPUT QUEUE IS ONE OF A PLURALITY OF OUTPUT QUEUES AND A ROUTING TABLE COMPRISES THE PLURALITY OF OUTPUT QUEUES 1004

THE OUTPUT QUEUE IS HOSTED ON AN INTERMEDIATE PEER 1006

THE OUTPUT QUEUE STORES THE OUTPUT DATA IN A PLURALITY OF PACKETS, WHEREIN EACH PACKET OF THE PLURALITY OF PACKETS COMPRISES A PACKET QUEUE THAT ORGANIZES THE OUTPUT DATA ACCORDING TO FRAMES AT WHICH THE OUTPUT DATA IS GENERATED 1008

FOR EACH PACKET OF THE PLURALITY OF PACKETS: STORE THE PACKET'S OUTPUT DATA IN THE PACKET QUEUE UNTIL A GLOBAL FRAME OF A SIMULATION IS HIGHER THAN AN OUTPUT FRAME AT WHICH A SET OF OUTPUT DATA STORED IN THE PACKET WAS GENERATED; AND WHEN THE GLOBAL FRAME IS UPDATED TO BE HIGHER THAN THE OUTPUT FRAME OF THE PACKET, COPY THE SET OF OUTPUT DATA FROM THE OUTPUT QUEUE INTO THE INPUT PACKET BUFFER OF THE SELECTED INPUT MODEL 1010

OPERATE ONE OR MORE OUTPUT MODELS OF THE PLURALITY OF OUTPUT MODELS (1) IN PARALLEL WITH ONE OR MORE INPUT MODELS OF THE PLURALITY OF INPUT MODELS AND/OR (2) ASYNCHRONOUSLY AT DIFFERENT FRAME RATES WITH RESPECT TO THE ONE OR MORE INPUT MODELS OF THE PLURALITY OF INPUT MODELS 1012

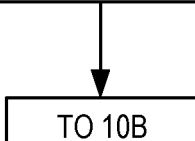

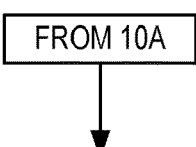

FROM 10A

STORE THE OUTPUT DATA IN THE OUTPUT QUEUE UNTIL A SELECTED INPUT MODEL OF THE PLURALITY OF INPUT MODELS IS READY TO STEP A SELECTED FRAME 1014

THE SELECTED INPUT MODEL OF THE PLURALITY OF INPUT MODELS IS READY TO STEP THE SELECTED FRAME WHEN PREREQUISITE DATA THAT IS NECESSARY FOR THE SELECTED INPUT MODEL TO STEP THE SELECTED FRAME IS AVAILABLE, WHEREIN THE PREREQUISITE DATA COMPRISES OUTPUT DATA GENERATED BY THE SELECTED OUTPUT MODEL, THE METHOD FURTHER COMPRISING: FOR THE SELECTED INPUT MODEL, DETERMINING THAT THE PREREQUISITE DATA IS AVAILABLE, AND ON CONDITION THAT THE PREREQUISITE DATA IS AVAILABLE FOR THE SELECTED INPUT MODEL, STEP THE SELECTED INPUT MODEL 1016

WHEN THE SELECTED INPUT MODEL OF THE PLURALITY OF INPUT MODELS IS READY TO STEP THE SELECTED FRAME, COPY THE OUTPUT DATA FROM THE OUTPUT QUEUE INTO A PACKET ROUTING TABLE OF THE SELECTED INPUT MODEL 1018

PRIOR TO COPYING THE OUTPUT DATA FROM THE OUTPUT QUEUE INTO THE INPUT PACKET BUFFER OF THE SELECTED INPUT MODEL: MAP A PACKET BUFFER REPRESENTATION OF THE OUTPUT DATA TO AN INPUT MODEL REPRESENTATION OF THE OUTPUT DATA; AND STORE OFFSET MAPPINGS OF THE PACKET BUFFER REPRESENTATION AND THE INPUT MODEL REPRESENTATION IN THE OUTPUT QUEUE 1020

GENERATE DETERMINISTIC RESULTS FROM THE COMPUTER SIMULATION ENVIRONMENT WHILE RUNNING ONE OR MORE OUTPUT MODELS OF THE PLURALITY OF OUTPUT MODELS AND ONE OR MORE INPUT MODELS OF THE PLURALITY OF INPUT MODELS IN PARALLEL CONFIGURATIONS 1022

DETERMINE THAT THE SELECTED INPUT MODEL NEEDS THE OUTPUT DATA AS PREREQUISITE DATA THAT IS NECESSARY FOR THE SELECTED INPUT MODEL TO STEP THE SELECTED FRAME; DETERMINE ONE OR MORE USE FRAMES AT WHICH THE SELECTED INPUT MODEL NEEDS TO USE THE PREREQUISITE DATA; AND USE AT LEAST THE ONE OR MORE USE FRAMES OF THE SELECTED INPUT MODEL TO DETERMINE WHEN TO DELETE THE PREREQUISITE DATA FROM THE OUTPUT QUEUE 1024

FIG. 10B

COMPUTER SIMULATION ENVIRONMENT WITH OUTPUT MODELS AND INPUT MODELS

BACKGROUND

Model-based design (MBD) and model-based engineering (MBE) are product development practices implemented in many fields, including the automotive and aerospace industries. Implementing MBD and MBE can reduce non-recurring development costs and product development cycle times. In some examples, MBD and/or MBE are implemented using simulation frameworks that are tailored to a specific implementation, and thus can be challenging to adapt for use in other scenarios. In addition, it can be challenging to update existing simulation environments to support increased model fidelity and higher throughput, while retaining deterministic testing capabilities.

SUMMARY

To address the above issues, according to one aspect of the present disclosure, a computing system is provided for executing a computer simulation environment. The computer simulation environment comprises a plurality of output models that produce output data and a plurality of input models that are waiting for a portion of the output data from the plurality of output models. The computer simulation environment further comprises a logic subsystem and a storage subsystem comprising executable instructions that, in response to execution by the logic subsystem, cause the computing system to implement at least a scheduler and a router.

The scheduler is configured to, for each of the input models, determine if prerequisite data that is necessary for the input model to step a selected frame is available. The prerequisite data comprises output data generated by one or more output models of the plurality of output models. On condition that the prerequisite data is available for the input model, the scheduler is configured to step the input model. The scheduler also maintains the output models and input models within a predetermined number of steps of each other. The router is configured to, when a selected output model of the plurality of output models finishes a step, copy the output data from an output buffer of the selected output model and send the output data to an output queue. The output data is stored in the output queue until a selected input model of the plurality of input models is ready to step the selected frame. When the selected input model of the plurality of input models is ready to step the selected frame, the router is configured to copy the output data from the output queue into a packet routing table of the selected input model.

This simplified summary of the specification is presented to provide a basic understanding of some aspects of the specification. This summary is not an extensive overview of the specification. It is intended to neither identify key or critical elements of the specification nor delineate any particular embodiments of the specification, or any scope of the claims. Its sole purpose is to present some concepts of the specification in a simplified form as a prelude to the more detailed description that is presented in this disclosure.

The features, functions, and advantages that have been discussed can be achieved independently in various embodiments or can be combined in yet other embodiments, further details of which can be seen with reference to the following description and drawings.

BRIEF DESCRIPTION OF THE DRAWINGS

FIG. 2 shows three examples of schedulers that can be used in the computer simulation environment of FIG. 1.

FIG. 3 shows a flow diagram of an example method for executing a computer simulation environment according to examples of the subject disclosure.

FIG. 8 shows another example use-case scenario of two models operating within a predetermined number of steps of each other according to examples of the subject disclosure.

FIG. 9 shows yet another example use-case scenario of two models operating within a predetermined number of steps of each other according to examples of the subject disclosure.

FIGS. 10A-10B show a flow diagram of an example method for routing data in a computer simulation environment according to examples of the subject disclosure.

DETAILED DESCRIPTION

Figure 1:
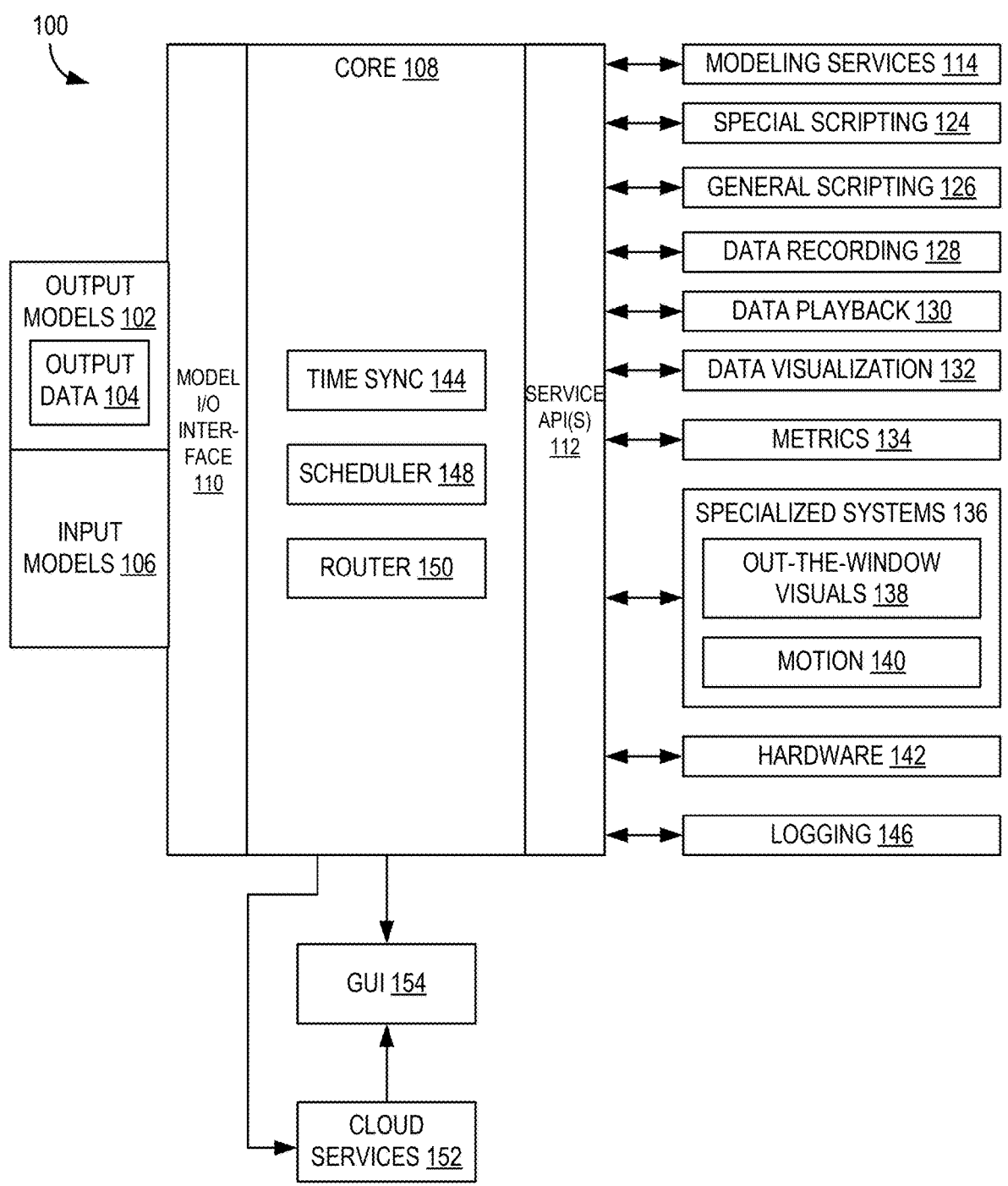
FIG. 1 shows one example of a computer simulation environment according to examples of the subject disclosure.

As introduced above, some model-based design (MBD) and/or model-based engineering (MBE) implementations use tailored simulation frameworks that can be challenging to adapt for use in other scenarios. It is costly and time-intensive to wrap, migrate, update, and tailor models to various simulation environments, and to similarly tailor simulation environments to their respective models. The growth and change of models and simulation environments can lead to the development of a large, monolithic code base that is challenging to maintain and distribute to users. In addition, it can be challenging to update existing simulation environments to support increased model fidelity and higher throughput, while retaining deterministic testing capabilities.

Accordingly, the disclosed examples relate to a computing system for executing a computer simulation environment that comprises a plurality of output models that produce output data and a plurality of input models that are waiting for a portion of the output data from the plurality of output models. Briefly, the computing system comprises a scheduler configured to, for each of the input models, determine if prerequisite data that is necessary for the input model to step a selected frame is available. The prerequisite data comprises output data generated by one or more output models of the plurality of output models. On condition that the prerequisite data is available for the input model, the input model is stepped. The plurality of output models and the plurality of input models are also maintained within a predetermined number of steps of each other.

The computing system further comprises a router configured to, when a selected output model of the plurality of output models finishes a step, copy the output data from an output buffer of the selected output model and send the output data to an output queue. The output data is stored in the output queue until a selected input model of the plurality of input models is ready to step the selected frame. When the selected input model of the plurality of input models is ready to step the selected frame, the output data is copied from the output queue into an input packet buffer of the selected input model.

Advantageously, and as described in more detail below, the configurations and systems described herein are cloud-enabled and scalable, providing computational capability for increasingly expanding real-time simulations. The systems support parallel operation, thereby achieving real-time or near-real-time speeds in a desktop computing environment, and achieve deterministic results even in parallel implementations. In one potential advantage of the present disclosure, the system also supports asynchronous system integration and vertically integrated systems. In this manner, MBD and MBE can be implemented for future product development and automated testing with increasing complexities. In addition, the system facilitates model reuse, eliminates rework, and enables intuitive development and seamless integration for models flowing in from a variety of sources, tools, and people.

FIG. 1 shows one example of a computer simulation environment 100 according to examples of the present disclosure. In different examples the computer simulation environment 100 can be executed on a variety of computing systems and/or in distributed environments, such as one or more cloud computing environments, network-accessible servers, desktop computers, laptop computers, and the like. Additional aspects of the computing system are described in more detail below with reference to FIG. 14.

The computer simulation environment 100 comprises a plurality of output models 102 that produce output data 104 and a plurality of input models 106 that are waiting for a portion of the output data 104 from the plurality of output models 102. The computer simulation environment 100 further comprises a simulation core 108. The simulation core 108 comprises a model input/output (I/O) interface 110. In some examples, the input models 106 and the output models 102 comprise functional mock-up interface (FMI) aligned models, also referred to as functional mock-up units (FMUs), and the model I/O interface 110 conforms to the FMI standard. In this manner, the computer simulation environment 100 is configured to facilitate model sharing among environments and address many use cases throughout a product development lifecycle. It will also be appreciated that, in other examples, the model I/O interface 110 interacts with the input models 106 and the output models 102 in any other suitable manner, such as via a custom interface.

The core 108 also includes one or more service application programming interfaces (APIs) 112 configured to interface with one or more internal or external services. In the example of FIG. 1, the one or more service APIs 112 interface with one or more modeling services 114, a specialized scripting service 124, a general scripting service 126, a data recording service 128, a data playback service 130, a data visualization service 132, a metrics service 134, one or more specialized systems 136, one or more hardware elements 142 and/or a logging service 146.

In some examples, the specialized scripting service 124 comprises a DO-330 scripting service that at least partially conforms to the Radio Technical Commission for Aeronautics (RTCA) DO-330 standard. DO-330 scripting is implemented in some examples to test and obtain results without a human in the loop.

The general scripting service 126 specifies the parameters of a simulation. For example, the parameters for one example aircraft simulation specify that the simulated aircraft climbs to an altitude of 20,000 feet, holds that altitude for 10 seconds, then descends. In some examples, the scripting is implemented in Python. In other examples, the scripting is implemented in another language (e.g., Java, Perl, Bash).

The data recording service 128 is configured to log and capture signals, communications, and/or other data generated during a simulation. In this manner, data can be analyzed to review the results of the simulation. In some examples, the data recording service 128 is implemented using a binary recording system that converts data to a human-readable format (e.g., American Standard Code for Information Interchange (ASCII) text or a comma separated value (CSV) file) after the data is captured.

The data playback service 130 is configured to replay recorded data. In some examples, the data playback service 130 replays data fed from an external source, such as an aircraft flight data recorder.

The data visualization service 132 is configured to provide a visual representation of simulation data. In some examples, the data visualization service 132 generates a plot of altitude or other data during a flight simulation, and/or depicts simulation data in the form of an aircraft instrument panel (e.g., an attitude indicator, an airspeed indicator, and an altimeter).

The metrics service 134 is configured to collect usage and performance metrics for the simulation environment 100. In some examples, the metrics service 134 records a processor's utilization and an amount of time taken to model a frame of a simulation.

The one or more specialized systems 136 are used to adapt the simulation environment 100 to different configurations, such as in different product development/testing labs. In some examples, for a flight simulation being executed in the simulation environment 100, the one or more specialized systems 136 generate out-the-window visuals 138 for display to a crew using a flight simulator, and the one or more specialized systems 136 translate simulation data into motion commands 140 (e.g., commands executable to control hydraulic systems of the flight simulator) to provide realistic motion feedback to the crew.

In some examples, the simulation environment 100 includes hardware 142 in the loop. In some examples, the hardware 142 comprises actual hardware. In other examples, the hardware 142 comprises virtual hardware. In yet other examples, the hardware 142 comprises a combination of actual and virtual hardware. For example, a functioning landing gear system can be plugged into a flight simulator and controlled by the simulation. As another example, the hardware 142 may comprise a full, functioning aircraft. As yet another example, the hardware 142 may comprise a virtual machine.

The core 108 further comprises a time sync module 144 that maintains internal time, a scheduler 148 and a router 150. Briefly, as described in more detail below and in one potential advantage of the present disclosure, the scheduler 148 is configured to, for each of the input models 106, determine if prerequisite data that is necessary for the input model to step a selected frame is available. The prerequisite data comprises output data generated by one or more of the output models 102. On condition that the prerequisite data is available for the input model 106, the input model is stepped. Additional details regarding the scheduler 148 are provided below with reference to FIGS. 2-3. Advantageously, the scheduler 148 allows models to run as soon as the prerequisite data is available.

Additionally, as described in more detail below and in another potential advantage of the present disclosure, the router 150 is configured to copy output data from an output buffer of a selected output model 102 and send the output data to an output queue when a selected output model of the output models 102 finishes a step. The output data is stored in the output queue until a selected input model 106 of the input models is ready to step the selected frame. When the selected input model 106 is ready to step the selected frame, the output data is copied data from the output queue into an input packet buffer of the selected input model 106. Additional details regarding the router 150 are provided below with reference to FIGS. 10-12. Advantageously, this routing mechanism allows models to be hosted in a distributed environment for parallel processing, and can handle large numbers of variables (e.g., 500,000 or more) that are involved in simulating complex systems, such as commercial aircraft. Additionally, and as described in more detail below, on the fly selective signal routing features are built into the core signal routing software so that signal consumers and generators can come on- and off-line during a simulation.

In some examples, outputs of the simulation core 108 are provided to one or more cloud services 152. The one or more cloud services 152 execute various simulation functions, such as model codegen and building, simulation building, simulation execution, data management, and analysis. In some examples, outputs of the one or more cloud services 152 and/or the simulation core 108 are used to generate a graphic user interface (GUI) 154.

Modular Scheduler Modes

FIG. 2 shows three examples of schedulers: a real-time scheduler 202, a first non-real-time scheduler 204, and a second non-real-time scheduler 206. The real-time scheduler 202, the first non-real-time scheduler 204, and/or the second non-real-time scheduler 206 can serve as the scheduler 148 of FIG. 1.

As shown in the example of FIG. 2, the scheduler design is modular. Different, light-weight scheduler modes can be easily swapped in and out. Each of the schedulers 202, 204, and 206 shown in FIG. 2 includes common code, which resides in the scheduler data structures 208, 210, and 212, respectively. Each scheduler owns a scheduler data structure, allowing straightforward implementation of a new scheduler. In some examples, the schedulers shown in FIG. 2 (the real-time scheduler 202, the first non-real-time scheduler 204, and the second non-real-time scheduler 206) each can be implemented in approximately 200 lines of code. The first non-real-time scheduler 204 is configured to create one thread per model and the second non-real-time scheduler 206 is configured to create one thread per sequence. To implement a different configuration, a new scheduler can be added by using one of the existing schedulers as a template, then modifying it. In some examples, the scheduler used during a run is selected and instantiated when the simulation environment is in a 'configuring' state, and the core may not change schedulers during runtime.

Scheduler Data

Each scheduler contains common code. Taking the scheduler data structure 210 as an example, the scheduler data structure 210 comprises references to a router 214 (e.g., the router 150 of FIG. 1), step handler 216, and a time sync module 218 (e.g., the time sync module 144 of FIG. 1). The scheduler data structure 210 contains logic to step the models, step model sequences, and update the global frame. The scheduler data structure 210 also contains debug controls 220 configured to handle debugging logic (e.g., pause, step, and resume).

The code of the scheduler data structure 210 is highly unit tested. Changes may be run following modifications, addition, and/or removal to/from the scheduler data structure 210 to verify that nothing is broken. In some examples, unit tests for the scheduler data structure 210 are stored at the bottom of the file they are testing.

The scheduler data structure 210 also contains waiting functions that are used in the stepping loops of each scheduler. In different examples, non-real-time schedulers wait on at least one of two conditions being satisfied (there is a separate method for each of them): 1) waiting for inputs to be available, and 2) waiting for slowest models to catch up. In some examples, non-real-time schedulers wait for at least both of these conditions to be satisfied before stepping an input model. Advantageously, waiting for inputs to be available ensures that when a model steps, all of the models it is dependent upon have finished stepping the appropriate frame. Waiting for the slowest models to catch up ensures that fast models don't 'run away', which thereby preserves memory resources and enables processors to be utilized for priority operations. Additional details on these waiting conditions are provided below with reference to FIGS. 7-9.

The waiting functions both look to a "frames of models" field 222, which is different from a current frame information field 224. The current frame information field 224 holds information on the lowest frame, and therefore determines when to update the global frame in the router 214 and time sync 218 modules. In some examples, the current frame information field 224 is protected by a single lock, which is coarsely ground and not highly efficient. Also, it stores information used by the debugging controls 220. On the other hand, in some examples, the frames of models field 222 is simply a list of the frames that each model has finished stepping. It is indexed by the models' IDs (which are sequential, starting from zero). The elements in the frames of models field 222 hold an atomicu64 of the frame to enable a fast read, and a lock around a u64 with that same frame number, which can be waited on with a condition variable. The current frame information field 224 has a 'current frames' field, which may or may not be the same, because it represents the current frame of each thread.

Advantageously, by placing the waiting logic inside the scheduler, it is easy to move walls around within the simulation environment 100 of FIG. 1, isolate and modify the logic of the waiting functions, analyze the waiting function efficiency, etc.

A real-time scheduler such as real-time scheduler 202 is simply time-based. It does not wait for any of the above conditions 1 and 2, and instead runs at a given temporal rate. Waiting for Inputs to be Available As described in more detail below with reference to FIG. 3, when attempting to step a model in a nonrealtime mode, the scheduler will first check to make sure that all of the model's inputs are available. The model waiting for inputs is referred to as the 'input model'. The models producing and outputting these inputs are referred to as 'output models'.

FIG. 3 shows a flow diagram depicting an example method 300 for executing a computer simulation environment that comprises a plurality of output models that produce output data and a plurality of input models that are waiting for a portion of the output data from the plurality of output models. The following description of method 300 is provided with reference to the components described herein and shown in FIGS. 1-2 and 4-14. In other examples, the method 300 is performed in other contexts using other suitable components.

At 302, the method 300 comprises, for each of the input models, determining if prerequisite data that is necessary for the input model to step a selected frame is available. The prerequisite data comprises selected output data generated by one or more output models of the plurality of output models.

In some examples, as indicated at 304, determining if the prerequisite data is available comprises calculating an output frame at which the selected output model is required to be. The determination that the prerequisite data is available for the selected input model is made on condition that the selected output model is at the output frame. When the output models are at a certain frame (as stored in the "frames of models" field 222), the scheduler determines that the input model's inputs are available.

In some examples, calculating the output frame at which the selected output model is required to be comprises, at 306, utilizing an input model frame rate of the selected input model and an output model frame rate of the selected output model. In some such examples, as indicated at 308, calculating the output frame at which the selected output model is required to be comprises determining whether the selected input model and the selected output model are in a same sequence. On condition that the prerequisite data is available for the input model, the method 300 continues to step the input model at 310.

Figure 4:
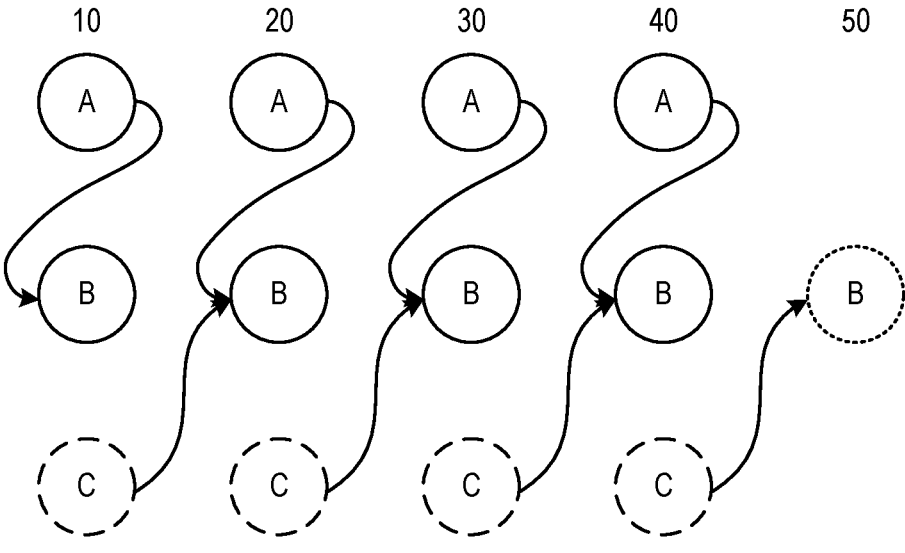
FIG. 4 shows an example use-case scenario of two models operating in a first, serial sequence and an additional model operating in a different sequence according to examples of the subject disclosure.

FIGS. 4-9 show several different use-case scenarios to demonstrate the data flow through output and input models. FIG. 4 shows a set of three models: A, B, and C. Each model steps once every 10 frames. Each vertical column represents a step and each arrow represents input. Model B accepts input from both A and C, but A and C do not accept any input themselves. In FIG. 4, models A and B, which are indicated by solid lines, are in the same serial sequence, in that order. Model C, indicated by dashed lines, is in a separate sequence.

In a serial sequence, models lower in the chain require input coming from higher models in the chain to be from the same frame. In this example models A and B are in a serial sequence in that order, with B expecting input from A on the same frame it is stepping. It follows that models A and B cannot run in parallel, because A has to be finished before B steps. Parallel sequences do not have this requirement. In serial mode, all models can run in parallel, but only if they do not require input from each other.

In this example, model B expects input from A on the same frame that it is stepping, but expects input from C before the frame it is stepping. At frame 50, model B is attempting to step, but first has to wait until model A finishes stepping frame 50. Alternatively, if A and B were in the same parallel sequence, then B would not take input from A at the same frame. Instead, B would take information from A from a previous frame, as if they were in different sequences.

Figure 5:
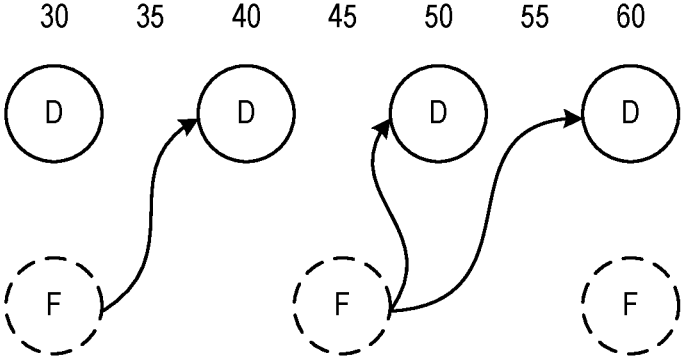
FIG. 5 shows another example use-case scenario in which two models are operating in different sequences and at different frame rates according to examples of the subject disclosure.

FIG. 5 shows another set of models D (indicated in solid lines) and F (indicated in dashed lines) in different sequences. In the example of FIG. 5, models D and F have different frame rates (D at rate 10 frames/step, F at rate 15 frames/step). Since F is slower than D, D takes input from model F at frame 45 twice. This is because F's most updated inputs for D at frames 50 and 60 are both from frame 45. At frame 60, D will not take F's output because they are in separate sequences. At frame 60, D looks for input from F from an earlier frame (e.g., frame 59 or earlier).

Figure 6:
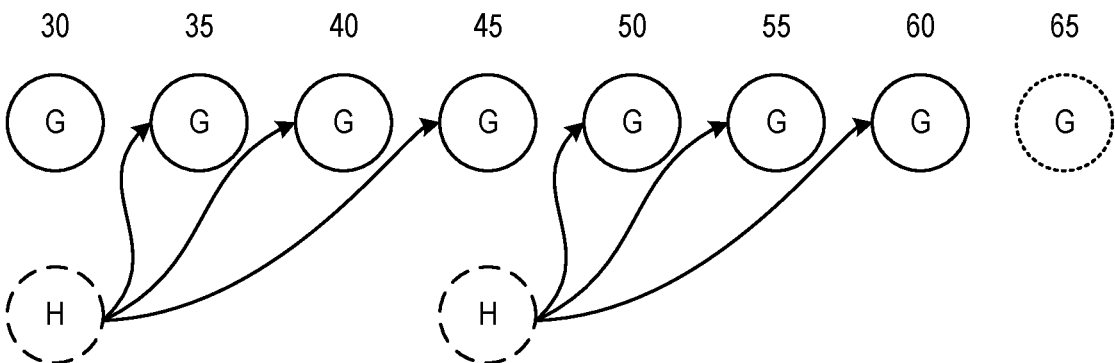
FIG. 6 shows yet another example use-case scenario of two models that are operating at different frame rates according to examples of the subject disclosure.

FIG. 6 shows another set of models G (indicated in solid lines) and H (indicated in dashed lines). In the example of FIG. 6, models G and H have different frame rates (G at rate 5 frames/step, H at rate 15 frames/step). Model G cannot step frame 65 until it receives input from H (at rate 15) from frame 60. The scheduler knows that H's latest frame is too far behind G, given H's rate of 15 frames/step. Waiting for Slowest Models to Catch Up By assuring that models wait for slower models to catch up before they step, the scheduler prevents fast models from running away. Runaway models can cause problems by 1) using CPU(s) that could be spent on slower models and/or 2) wasting memory. As described below with reference to the router, a model's output packets are stored for each step until no longer needed. Accordingly, if a first model was 100 steps ahead of a second model, then 100 versions of the first model's output packets would have to be stored until the second model reads them.

Figure 7:
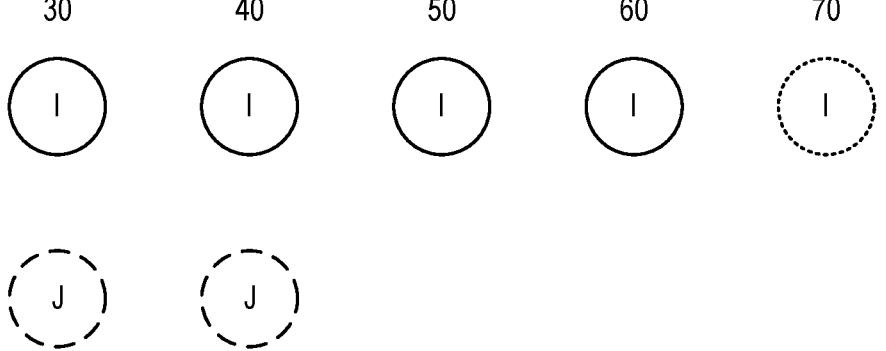
FIG. 7 shows an example use-case scenario of two models operating at the same frame rate and within a predetermined number of steps of each other according to examples of the subject disclosure.

FIGS. 7-9 show three example scenarios that demonstrate how this functionality of waiting for the slowest model(s) to catch up operates based on models' rates and current frames. No input arrows are illustrated in FIGS. 7-9, as this functionality applies to all models regardless of any input dependencies. In these examples, and as indicated at step 312 of FIG. 3, a plurality of output models and a plurality of input models are maintained within a predetermined number of steps of each other to prevent faster models from running away. In the examples shown in FIGS. 7-9, the models are kept within two steps of each other. It will also be appreciated that any other value can be used (e.g., three steps or 100 steps), and such value can be a static value or a dynamic value.

FIG. 7 shows two models, I and J, that step at the same rate of 10 frames/step. In this example model I is attempting to step frame 70. However model I is waiting because frame 70 is greater than two steps ahead of model J which is at frame 40. In this example, the number of steps that model I is ahead is based on the further-behind model's rate (e.g., model J).

FIG. 8 shows another two models, K and L. Model K steps at a rate of 5 frames/step and model L steps at a rate of 20 frames/step. Model K can step all the way through frame 60 because frame 60 is within two of model L's steps (at 20 frames/step). But model K cannot step frame 65 until model L steps to frame 40.

FIG. 9 shows yet another example of two models N and O. In the example of FIG. 9, model N steps at a rate of 40 frames/step and model O steps at a rate of 5 frames/step. Model N cannot step further than two steps ahead of model O, which would be frame 40 (model O's current frame (30)+(2×5)). Model N could be waiting for a relatively long period in this configuration. However, all of the models requiring input from model N will advance when they have their prerequisite data from model N's frame 20 output, until eventually model O and others advance. Then model N can step again.

With reference again to FIG. 3 and returning to method 300, at 314 the method 300 comprises, when a selected output model of the plurality of output models finishes a step, copying the output data from an output buffer of the selected output model and sending the output data to an output queue. The output data comprises at least a portion of the prerequisite data that is necessary for a selected input model to step the selected frame. The output data is stored in the output queue until the selected input model is ready to step the selected frame. When the selected input model is ready to step the selected frame, the output data is copied from the output queue into an input packet buffer of the selected input model. In some examples, step 314 is implemented at the router 150 of FIG. 1. Additional details regarding the router are provided in more detail below with reference to FIGS. 10-14.

Advantageously, and as indicated at 316 of method 300, the configurations of the present disclosure enable one or more output models to be operated (1) in parallel with one or more input models of the plurality of input models and/or (2) asynchronously at different frame rates with respect to the one or more input models of the plurality of input models. In one potential advantage of the present disclosure, the simulation environment 100 can accept asynchronous interrupts in signals passed back and forth between models, without the system crashing or generating errors. For example, and as described above, FIGS. 6, 7, 9 and 10 depict examples of two models operating at different frame rates with respect to one another. Advantageously, the present configurations can align with the asynchronous operation of real-world components of complex products, such as commercial aircraft.

Additionally, as indicated at 318 and in another potential advantage of the present disclosure, the simulation environment 100 generates deterministic results while running one or more output models and one or more input models in parallel configurations. In this manner, the simulation environment provides robust computational capability for carrying out simulations while providing reliable results for MBD and MBE.

Router

As described in more detail below with reference to FIGS. 10A-10B, and in one potential advantage of the present disclosure, the router design queues output data from an output model prior to transmission to an input model until the input model is ready to step a selected frame. For example, output buffers residing in an output model's routing table are used to stage the output before committing to send it. In this manner, the present configurations eliminate the need for staging input buffers in input models that are required in systems that queue output data on receipt. In these systems, for a model that just finished stepping, the need to write its output to another model's staging input buffer can cause issues with synchronization. Advantageously, by eliminating the need for such staging input buffers in models, the present design avoids such issues and provides a simpler configuration.

FIGS. 10A and 10B show a flow diagram depicting an example method 1000 for routing data in a computer simulation environment that comprises a plurality of output models that produce output data and a plurality of input models that utilize the output data. The following description of method 1000 is provided with reference to the components described herein and shown in FIGS. 1-9 and 11-14. In other examples, the method 1000 is performed in other contexts using other suitable components.

With reference first to FIG. 10A, at 1002, the method 1000 comprises, when a selected output model finishes a step, copying the output data from an output buffer of the selected output model and sending the output data to an output queue. In some examples, as indicated at 1004, the output queue is one of a plurality of output queues and a routing table comprises the plurality of output queues. As described further below, the output data is stored in the output queue until a selected input model is ready to step a selected frame, at which point the output data is copied from the output queue into an input packet buffer of the selected input model.

Figure 11:
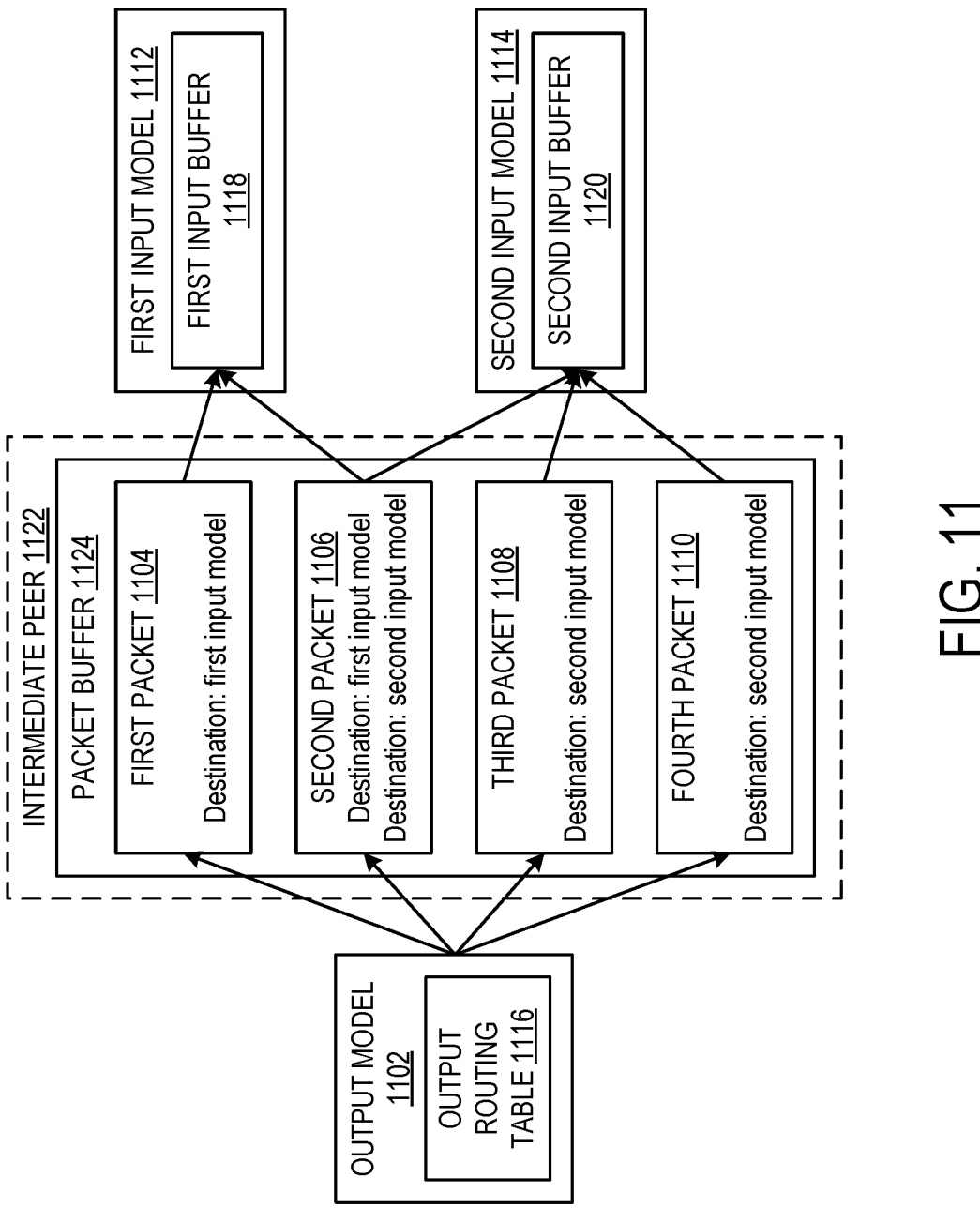
FIG. 11 shows an example of an output model generating output data that is provided to an input model according to examples of the subject disclosure.

FIG. 11 shows one example of an output model 1102 generating output data in the form of a first packet 1104, a second packet 1106, a third packet 1108, and a fourth packet 1110. The first packet 1104 and the second packet 1106 are destined for a first input model 1112. The second packet 1106, the third packet 1108, and the fourth packet 1110 are destined for a second input model 1114.

The output model 1102 comprises an output routing table 1116 that serves as an output buffer and an output queue to stage one or more output packets before committing to sending the output packets. The first input model 1112 and the second input model 1114 also comprise a first input buffer 1118 and a second input buffer 1120, respectively. In some examples, the first input buffer 1118 and the second input buffer 1120 each comprise a routing table.

In some examples and as indicated at 1006 of FIG. 10A, the output queue is hosted on an intermediate peer. FIG. 11 shows one example of an optional intermediate peer 1122 comprising a packet buffer 1124 that hosts the packets output by the output model 1102 before transmitting the packets on to the first input model 1112 and/or the second input model 1114.

Figure 12:
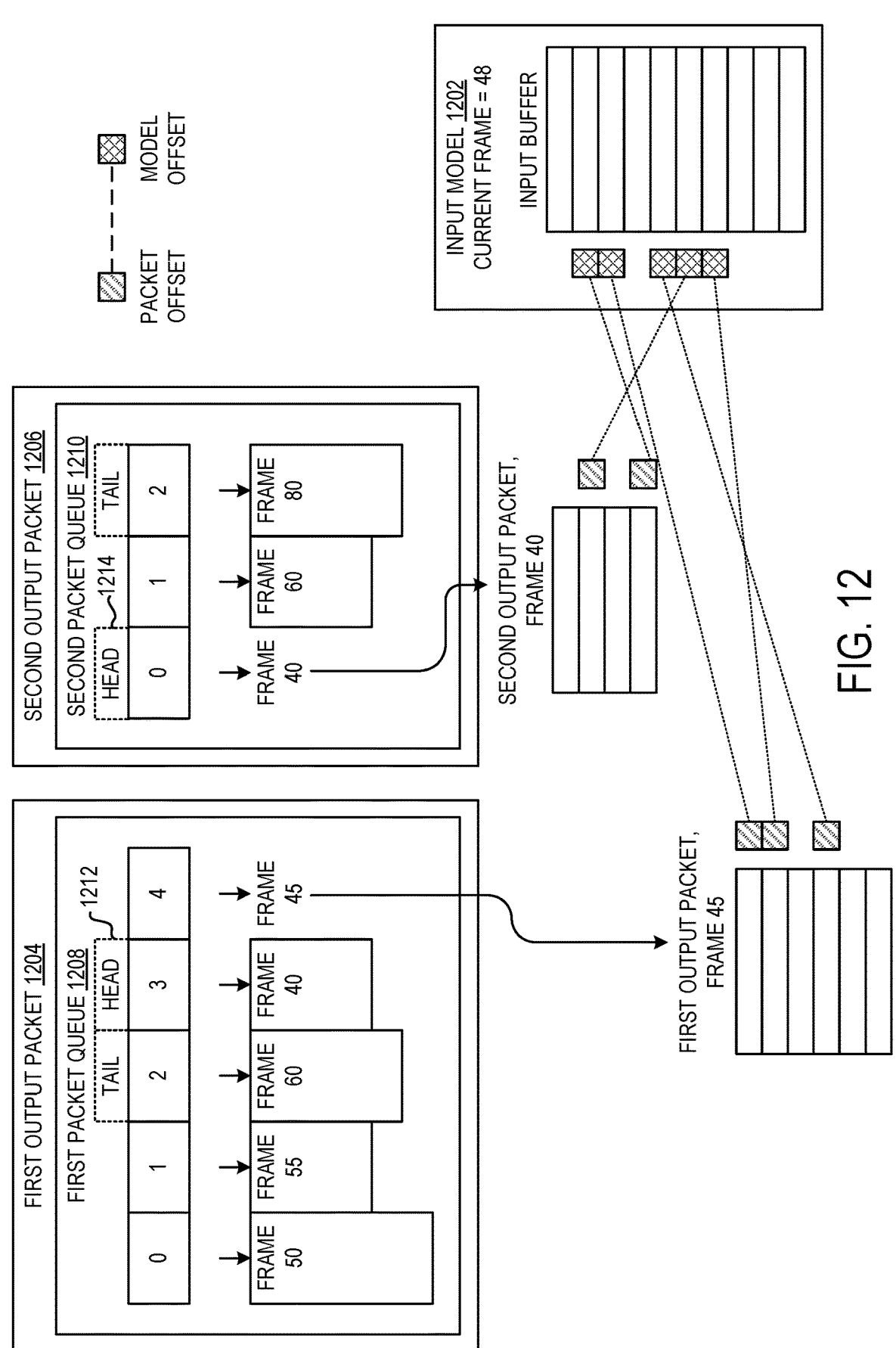
FIG. 12 shows an example of an input model receiving data from two output packets according to examples of the subject disclosure.

With reference again to FIG. 10A, at 1008, the output queue stores the output data in a plurality of packets. Each packet of the plurality of packets comprises a packet queue that organizes the output data according to frames at which the output data is generated. With reference now to FIG. 12, another example of an input model 1202 receiving data from a first output packet 1204 and a second output packet 1206 is schematically illustrated. In this example the first output packet 1204 has a first packet queue 1208 and the second output packet 1206 has a second packet queue 1210. In this example, the first packet queue 1208 and the second packet queue 1210 each store packets in the order of the frames at which the output data is generated.

With reference again to FIG. 10A, at 1010 the method 1000 comprises, for each packet of the plurality of packets, storing the packet's output data in the packet queue until a current frame of the selected input model is higher than an output frame at which a set of output data stored in the packet was generated. When the current frame is updated to be higher than the output frame of the packet, the set of output data is copied from the output queue into the input packet buffer of the selected input model.

For example, and with reference again to FIG. 12, the first packet queue 1208 is holding packets from frames 40, 45, 50, 55, and 60. In some examples the frame of a packet is indicated in a header of the packet. Similarly, the second packet queue 1210 is holding packets from frames 40, 60, and 80. When the current frame of the input model 1202 is updated to frame 48, then the first packet queue 1208 releases the packet from frame 45 and the second packet queue 1210 releases the packet from frame 40. In some examples, in each queue the newest packet before the input model's current frame is selected and released.

As introduced above, in some examples, and as indicated at 1012 of FIG. 10A, one or more output models of the plurality of output models may be operated asynchronously at different frame rates with respect to one or more input models of the plurality of input models. Advantageously in this manner, and by storing the packets in a queue, no knowledge of how many packets are going to be stored is required. For example, in simulation environments that cannot operate input and output models asynchronously, if a model A is stepping at a rate of 1 frame/step, and a model B is stepping at a rate of 100 frames/step, up to 100 packets from model A would need to be stored before model B could get the data it needs from the packets. In the present configurations, by avoiding the need to determine how many packets are going to be stored, such information is not required to be passed from the scheduler to the router. In this manner, the router may operate autonomously with no knowledge of the scheduler.

Returning to the example of FIG. 12, and in another potential advantage of the present disclosure, the first packet queue 1208 and the second packet queue 1210 each comprise static memory allocations. In contrast, other systems that utilize dynamic memory allocation when enqueueing and dequeuing data are computationally more expensive. Advantageously, in the present configurations the static memory allocations reuse allocated buffers, as shown in FIG. 12. When a packet is dequeued, its buffer is not dropped from the memory allocation. Instead, a 'head' pointer is incremented. For example, when a packet is dequeued from the first packet queue 1208, a first head pointer 1212 is incremented. Similarly, when a packet is dequeued from the second packet queue 1210, a second head pointer 1214 is incremented. Thus, each queue is a circular queue, implemented as an array.

When a packet is enqueued, new memory is only allocated if all of the current buffers have not been 'dequeued'. If a buffer has been 'dequeued', it will be overwritten. Therefore, while some dynamic allocation takes place initially, the queue will stop growing very quickly after initialization.

Additionally and as described above, the static memory allocation is preserved by the implementation of the scheduler to prevent runaway model execution. Further, even in a situation where the scheduler does not prevent runaway, the queue detects the runaway model and outputs an error before output generated by the runaway model grows too large.

In some examples, each buffer in the queue itself also comprises a static memory allocation. For example, if one node in the queue holds a 50 kB packet, but a next packet being enqueued to this node is 60 kB, more memory will be allocated to the node. In these examples, eventually the memory allocation will reach an equilibrium state, and no more dynamic memory allocation will take place.

With reference now to FIG. 10B and as noted above, at 1014, the method 1000 comprises storing the output data in the output queue until a selected input model is ready to step a selected frame. As introduced above, and as indicated at 1016, the selected input model is ready to step the selected frame when prerequisite data that is necessary for the selected input model to step the selected frame is available. The prerequisite data comprises output data generated by the selected output model. In some examples, the method 1000 further comprises, for the selected input model, determining that the prerequisite data is available. On condition that the prerequisite data is available for the selected input model, the method 1000 comprises stepping the selected input model.

At 1018, the method 1000 comprises, when the selected input model of the plurality of input models is ready to step the selected frame, copying the output data from the output queue into an input buffer of the selected input model. In some examples, at 1020, prior to copying the output data from the output queue into the input packet buffer of the selected input model, the method 1000 comprises mapping a packet buffer representation of the output data to an input model representation of the output data; and storing offset mappings of the packet buffer representation and the input model representation in the output queue.

For example, before a model steps, it receives all of its inputs from the model router by calling a receive function. The receive function comprises instructions to copy all of the prerequisite input data from the packets into the model. The input data is found from the model routing table, which describes the packets and the routes in those packets that the model expects to receive. In some examples, since the offset of a route in a packet may be different from its offset in the model buffer, a mapping of these offsets is stored in a data structure that contains the model offset and the packet offset of a route.

In some examples the process of receiving data is implemented as follows: 1) iterating over the packets the model expects as input, 2) for each of the packets, retrieve, from its packet queue, the latest packet that is before or at the input model's current frame (as introduced above, whether the input model looks to a previous frame or the current frame depends on whether the input model and output model(s) are in the same sequence), and 3) iterating over the buffer offset data structures pertaining to this input model and packet. Each route is copied into the model at the correct offset.

In the example of FIG. 12, the input model 1202 is receiving its input data from the first output packet 1204 and the second output packet 1206. The packets selected from their queues are the newest packets before the model's current frame, which is 48. As shown in FIG. 12, the first output packet 1204 is generated at a rate of 5 frames per step, and the second output packet 1206 is produced at a rate of 20 frames per step. All of the offsets pertaining to the input model 1202 for the first output packet 1204 and the second output packet 1206 are iterated over and used to determine what part of the packets to copy into the models input.

To access the values of each route to send to a user when requested, the value of a route is referred to in the most recent packet containing it. If two separate packets contain the same route, these values are expected to be equal. If they are not, then this means that two different models are outputting different values for the same route, which is a simulation error. In this case, the same model will always be referenced and accordingly will have the same output values and therefore will be deterministic. In this manner, and as indicated at 1022 of FIG. 10B, the method 1000 is configured to generate deterministic results from the computer simulation environment while running one or more output models of the plurality of output models and one or more input models of the plurality of input models in parallel configurations.

In some examples where no models output a particular route, the value of the route in a packet is not available. These routes are input-only routes. In some examples of these cases, a small sample buffer is stored in the route object, which is stored in the packet routing table. Routes are determined as input-only during the building of the packet routing table, and then assigned a sample buffer. If a user requests the value of an input-only route, the value is read from the sample buffer instead of a packet.

As introduced above, and with reference again to FIG. 10B, at 1024 the method 1000 comprises determining that the selected input model needs the output data as prerequisite data that is necessary for the selected input model to step the selected frame, determining one or more use frames at which the selected input model needs to use the prerequisite data, and using at least the one or more use frames of the selected input model to determine when to delete the prerequisite data from the output queue. For example, where a particular input model is the last model that needs the prerequisite data, this data can be deleted from the output queue when the data is copied to this particular model's buffer. In some examples, the prerequisite data is also used to determine when to delete or stop storing data queued on transmission.

Figure 13:
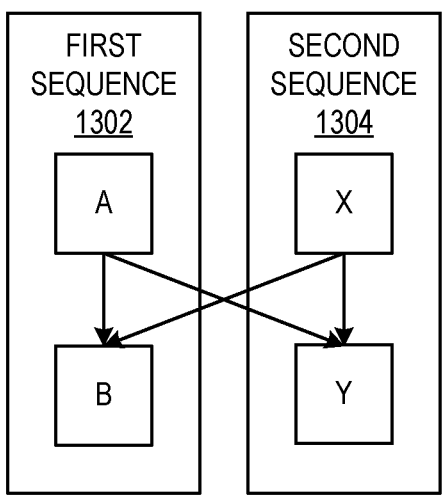
FIG. 13 shows an example of two models operating in a first sequence and another two models operating in a separate sequence according to examples of the subject disclosure.

Advantageously and as described above, by storing output data in a queue until a model is ready to step, rather than using a 'staging' input buffer, the router configurations of the present disclosure prevent deadlock when two models in different sequences depend on each other. For example, FIG. 13 shows one example of two models 'A' and 'B' in a first sequence 1302. Models 'X' and 'Y' are in a different sequence 1304. Model B expects input from model A from the same frame that it is stepping. Model B also expects inputs from model X. Model Y expects input from model X from the same frame that it is stepping. Model Y also expects input from model A.

In some examples of simulation environments that utilize 'staging' input buffers, deadlock can occur if model B is waiting for input from A, but A cannot finish stepping its frame until model Y finishes the same frame. Similarly, model Y is waiting for input from model X, but X cannot finish its frame until it copies its data into B, which will not be ready for X's output data until it advances to the next frame. As such, these models will become stuck.

In these examples that utilize 'staging' input buffers, the models are waiting both before they step (to receive their inputs) and after they step (so that they won't send their output packets until the receiving models are ready for them). Advantageously and as described above, by queueing the packets when they are sent, models in the configurations of the present disclosure never have to wait to send their outputs. Models only ever wait before they step.

Advantageously, simulation cores utilizing configurations of the present disclosure are easier to maintain relative to using other simulation architectures. For example, unit tests can be created, run and maintained upon any modification to the code. Code is broken down into small, maintainable methods which allows for isolating chunks of code to help with debugging and performance analysis. Utilizing such smaller units of code also increases readability. Additionally, moving all of the waiting and timing logic into the scheduler decouples the router logic from synchronization, and allows router performance to be accurately analyzed.

In another advantage of the present disclosure, simulation environments that queue output packets as described above can substantially reduce simulation runtimes as compared to environments that utilize staging input buffers. Furthermore, the simulation environments of the present disclosure can run multiple sequences in parallel without deadlock, which provides significant opportunities to further increase speed through parallelization.

In some embodiments, the examples described herein can be tied to a computing system of one or more computing devices. In particular, aspects of such methods and processes can be implemented as a computer-application program or service, an application-programming interface (API), a library, and/or other computer-program product.

Figure 14:
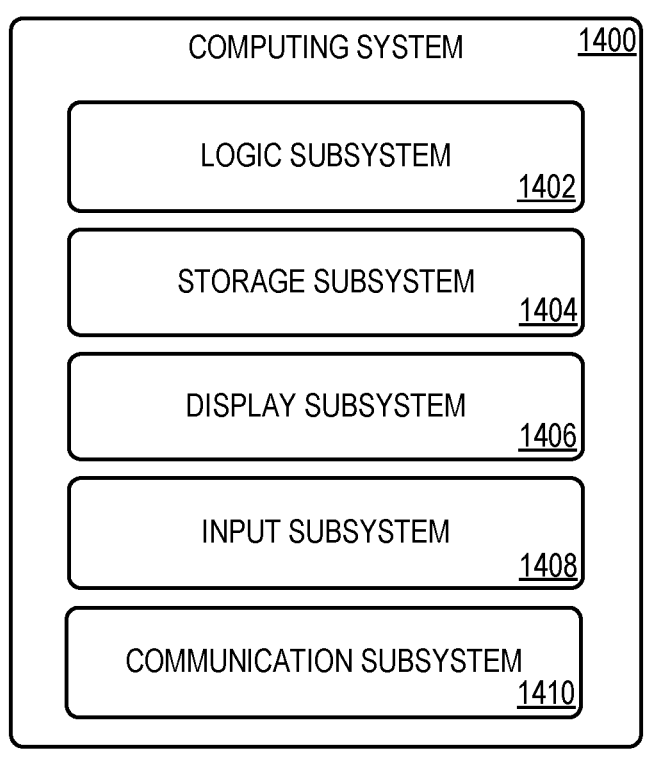
FIG. 14 shows a block diagram of an example computing system according to examples of the subject disclosure.

FIG. 14 schematically shows a non-limiting embodiment of a computing system 1400 that can enact one or more of the examples described above. For example, computing system 1400 can be used to execute instructions to execute the simulation environment 100 of FIG. 1, to perform the method 300 of FIG. 3 and method 1000 of FIGS. 10A-10B, and/or potentially perform other functions.

Computing system 1400 is shown in simplified form. Computing system 1400 can take the form of one or more personal computers, server computers, tablet computers, network computing devices, mobile computing devices, mobile communication devices (e.g., smart phone), and/or other computing devices.

Computing system 1400 includes a logic subsystem 1402, a storage subsystem 1404, and a display subsystem 1406. Computing system 1400 can optionally include an input subsystem 1408, a communication subsystem 1410, and/or other components not shown in FIG. 14.

Logic subsystem 1402 includes one or more physical devices configured to execute instructions. For example, logic subsystem 1402 can be configured to execute instructions that are part of one or more applications, services, programs, routines, libraries, objects, components, data structures, or other logical constructs. Such instructions can be implemented to perform a task, implement a data type, transform the state of one or more components, achieve a technical effect, or otherwise arrive at a desired result. For example, logic subsystem 1402 can be used to execute instructions to execute the simulation environment 100 of FIG. 1 and to perform the method 300 of FIG. 3 and method 1000 of FIGS. 10A-10B.

Logic subsystem 1402 can include one or more processors configured to execute software instructions. Additionally or alternatively, logic subsystem 1402 can include one or more hardware or firmware logic machines configured to execute hardware or firmware instructions. Processors of logic subsystem 1402 can be single-core or multi-core, and the instructions executed thereon can be configured for sequential, parallel, and/or distributed processing. Individual components of logic subsystem 1402 optionally can be distributed among two or more separate devices, which can be remotely located and/or configured for coordinated processing. Aspects of logic subsystem 1402 can be virtualized and executed by remotely accessible, networked computing devices configured in a cloud-computing configuration.

Storage subsystem 1404 includes one or more physical devices configured to hold instructions executable by logic subsystem 1402 to implement the methods and processes described herein. For example, storage subsystem 1404 can hold instructions executable to execute the simulation environment 100 of FIG. 1, to perform the method 300 of FIG. 3 and method 1000 of FIGS. 10A-10B, and/or potentially perform other functions. When such methods and processes are implemented, the state of storage subsystem 1404 can be transformed—e.g., to hold different data.

Storage subsystem 1404 can include removable and/or built-in devices. Storage subsystem 1404 can include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage subsystem 1404 can include volatile, nonvolatile, dynamic, static, read/write, read-only, random-access, sequential-access, location-addressable, file-addressable, and/or content-addressable devices.

It will be appreciated that storage subsystem 1404 includes one or more physical devices. However, aspects of the instructions described herein alternatively may be propagated by a communication medium (e.g., an electromagnetic signal, an optical signal, etc.) that is not held by a physical device for a finite duration.

Aspects of logic subsystem 1402 and storage subsystem 1404 can be integrated together into one or more hardware-logic components. Such hardware-logic components can include field-programmable gate arrays (FPGAs), program- and application-specific integrated circuits (PASIC/ASICs), program- and application-specific standard products (PSSP/ASSPs), system-on-a-chip (SOC), and complex program-mable logic devices (CPLDs), for example.

Display subsystem 1406 can be used to present a visual representation of data held by storage subsystem 1404. This visual representation can take the form of a GUI. As the herein described methods and processes change the data held by the storage subsystem 1404, and thus transform the state of the storage machine, the state of display subsystem 1406 can likewise be transformed to visually represent changes in the underlying data. For example, display subsystem 1406 can be configured to display the GUI 154 of FIG. 1.

Display subsystem 1406 can include one or more display devices utilizing virtually any type of technology. Such display devices can be combined with logic subsystem 1402 and/or storage subsystem 1404 in a shared enclosure, or such display devices can be peripheral display devices.

When included, input subsystem 1408 can comprise or interface with one or more user-input devices such as a keyboard, mouse, touch screen, or game controller. In some embodiments, the input subsystem 1408 can comprise or interface with selected natural user input (NUI) componen-try. Such componentry can be integrated or peripheral, and the transduction and/or processing of input actions can be handled on- or off-board. Example NUI componentry can include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity. For example, input subsystem 1408 can be configured to receive user inputs while executing the simulation environment 100, performing the method 300, performing the method 1000, and/or displaying the GUI 154.

When included, communication subsystem 1410 can be configured to communicatively couple computing system 1400 with one or more other computing devices. Communication subsystem 1410 can include wired and/or wireless communication devices compatible with one or more different communication protocols. As non-limiting examples, the communication subsystem can be configured for communication via a wireless telephone network, or a wired or wireless local- or wide-area network. In some embodiments, communication subsystem 1410 can allow computing system 1400 to send and/or receive messages (e.g., output data from the output model 1102 of FIG. 11) to and/or from other devices via a network such as the Internet. For example, communication subsystem 1410 can be used receive or send data to another computing system. As another example, communication subsystem may be used to communicate with other computing systems during execution of method 300 or 1000 in a distributed computing environment.

Further, the disclosure comprises configurations according to the following clauses.

Clause 1. A method for executing a computer simulation environment that comprises a plurality of output models that produce output data and a plurality of input models that are waiting for a portion of the output data from the plurality of output models, the method comprising: for each of the input models: determining if prerequisite data that is necessary for the input model to step a selected frame is available, wherein the prerequisite data comprises selected output data generated by one or more output models of the plurality of output models; on condition that the prerequisite data is available for the input model, stepping the input model; and maintaining the plurality of output models and the plurality of input models within a predetermined number of steps of each other.

Clause 2. The method of clause 1, wherein the one or more output models comprise a selected output model, and determining if the prerequisite data is available for a selected input model of the plurality of input models comprises: calculating an output frame at which the selected output model is required to be; and on condition that the selected output model is at the output frame, determining that the prerequisite data is available for the selected input model.

Clause 3. The method of clause 2, wherein calculating the output frame at which the selected output model is required to be comprises utilizing an input model frame rate of the selected input model and an output model frame rate of the selected output model.

Clause 4. The method of clause 3, wherein calculating the output frame at which the selected output model is required to be comprises determining whether the selected input model and the selected output model are in a same sequence.

Clause 5. The method of clause 1, further comprising generating deterministic results from the computer simulation environment while running one or more output models of the plurality of output models and one or more input models of the plurality of input models in parallel configurations.

Clause 6. The method of clause 1, further comprising operating one or more output models of the plurality of output models (1) in parallel with one or more input models of the plurality of input models and/or (2) asynchronously at different frame rates with respect to the one or more input models of the plurality of input models.

Clause 7. The method of clause 1, further comprising: when a selected output model of the plurality of output models finishes a step, copying the output data from an output buffer of the selected output model and sending the output data to an output queue, wherein the output data comprises at least a portion of the prerequisite data that is necessary for a selected input model of the plurality of input models to step the selected frame; storing the output data in the output queue until the selected input model is ready to step the selected frame; and when the selected input model is ready to step the selected frame, copying the output data from the output queue into an input packet buffer of the selected input model.

Clause 8. A method for routing data in a computer simulation environment that comprises a plurality of output models that produce output data and a plurality of input models that utilize the output data, the method comprising: when a selected output model of the plurality of output models finishes a step, copying the output data from an output buffer of the selected output model and sending the output data to an output queue; storing the output data in the output queue until a selected input model of the plurality of input models is ready to step a selected frame; and when the selected input model of the plurality of input models is ready to step the selected frame, copying the output data from the output queue into an input buffer of the selected input model.

Clause 9. The method of clause 8, wherein the output queue is one of a plurality of output queues, and a routing table comprises the plurality of output queues.

Clause 10. The method of clause 8, wherein the output queue is hosted on an intermediate peer.

Clause 11. The method of clause 8, further comprising, prior to copying the output data from the output queue into the input buffer of the selected input model: mapping a packet buffer representation of the output data to an input model representation of the output data; and storing offset mappings of the packet buffer representation and the input model representation in the output queue.

Clause 12. The method of clause 8, wherein the output queue stores the output data in a plurality of packets, wherein each packet of the plurality of packets comprises a packet queue that organizes the output data according to frames at which the output data is generated.

Clause 13. The method of clause 12, further comprising, for each packet of the plurality of packets: storing the packet's output data in the packet queue until a current frame of the selected input model is higher than an output frame at which a set of output data stored in the packet was generated; and when the current frame is updated to be higher than the output frame of the packet, copying the set of output data from the output queue into the input buffer of the selected input model.

Clause 14. The method of clause 8, further comprising: determining that the selected input model needs the output data as prerequisite data that is necessary for the selected input model to step the selected frame; determining one or more use frames at which the selected input model needs to use the prerequisite data; and using at least the one or more use frames of the selected input model to determine when to delete the prerequisite data from the output queue.

Clause 15. The method of clause 8, wherein the selected input model of the plurality of input models is ready to step the selected frame when prerequisite data that is necessary for the selected input model to step the selected frame is available, wherein the prerequisite data comprises output data generated by the selected output model, the method further comprising: for the selected input model, determining that the prerequisite data is available; and on condition that the prerequisite data is available for the selected input model, stepping the selected input model.

Clause 16. The method of clause 8, further comprising generating deterministic results from the computer simulation environment while running one or more output models of the plurality of output models and one or more input models of the plurality of input models in parallel configurations.

Clause 17. The method of clause 8, further comprising operating one or more output models of the plurality of output models (1) in parallel with one or more input models of the plurality of input models and/or (2) asynchronously at different frame rates with respect to the one or more input models of the plurality of input models.

Clause 18. A computing system for executing a computer simulation environment that comprises a plurality of output models that produce output data and a plurality of input models that are waiting for a portion of the output data from the plurality of output models, the computing system comprising: a logic subsystem; and a storage subsystem comprising executable instructions that, in response to execution by the logic subsystem, cause the computing system to implement at least: a scheduler configured to, for each of the input models: determine if prerequisite data that is necessary for the input model to step a selected frame is available, wherein the prerequisite data comprises output data generated by one or more output models of the plurality of output models, on condition that the prerequisite data is available for the input model, step the input model; and maintain the plurality of output models and the plurality of input models within a predetermined number of steps of each other; and a router configured to: when a selected output model of the plurality of output models finishes a step, copy the output data from an output buffer of the selected output model and send the output data to an output queue, store the output data in the output queue until a selected input model of the plurality of input models is ready to step the selected frame, and when the selected input model of the plurality of input models is ready to step the selected frame, copy the output data from the output queue into an input packet buffer of the selected input model.

Clause 19. The computing system of clause 18, wherein the plurality of output models and the plurality of input models are configured to generate deterministic results while running in parallel configurations.

Clause 20. The computing system of clause 18, wherein one or more output models of the plurality of output models are configured to operate (1) in parallel with one or more input models of the plurality of input models and/or (2) asynchronously at different frame rates with respect to the one or more input models of the plurality of input models.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method for executing a computer simulation environment that comprises a plurality of output models that produce output data and a plurality of input models that are waiting for a portion of the output data from the plurality of output models, wherein one or more of the models step at a rate of multiple frames per step, the method comprising:

for each of the input models:

determining if prerequisite data is available, wherein the prerequisite data comprises selected output data generated by one or more output models of the plurality of output models;

on condition that the prerequisite data is available for the input model, stepping the input model; and maintaining the plurality of output models and the plurality of input models within a predetermined number of steps of each other to prevent a faster model from running away from a slower model.

2. The method of claim 1, wherein the one or more output models comprise a selected output model, and determining if the prerequisite data is available for a selected input model of the plurality of input models comprises:

calculating an output frame at which the selected output model is required to be; and on condition that the selected output model is at the output frame, determining that the prerequisite data is available for the selected input model.

3. The method of claim 2, wherein calculating the output frame at which the selected output model is required to be comprises utilizing an input model frame rate of the selected input model and an output model frame rate of the selected output model.

4. The method of claim 3, wherein calculating the output frame at which the selected output model is required to be comprises determining whether the selected input model and the selected output model are in a same sequence.

5. The method of claim 1, further comprising generating deterministic results from the computer simulation environment while running one or more output models of the plurality of output models and one or more input models of the plurality of input models in parallel configurations.

6. The method of claim 1, further comprising operating one or more output models of the plurality of output models (1) in parallel with one or more input models of the plurality of input models and/or (2) asynchronously at different frame rates with respect to the one or more input models of the plurality of input models.

7. The method of claim 1, further comprising:

when a selected output model of the plurality of output models finishes a step, copying the output data from an output buffer of the selected output model and sending the output data to an output queue, wherein the output data comprises at least a portion of the prerequisite data;

storing the output data in the output queue until a selected input model of the plurality of input models is ready to step a selected frame; and when the selected input model is ready to step the selected frame, copying the output data from the output queue into an input packet buffer of the selected input model.

8. A method for routing data in a computer simulation environment that comprises a plurality of output models that produce output data and a plurality of input models that utilize the output data, wherein one or more of the models step at a rate of multiple frames per step, the method comprising:

when a selected output model of the plurality of output models finishes a step, copying the output data from an output buffer of the selected output model and sending the output data to an output queue;

storing the output data in the output queue until a selected input model of the plurality of input models is ready to step a selected frame; and when the selected input model of the plurality of input models is ready to step the selected frame, copying the output data from the output queue into an input buffer of the selected input model; and maintaining the plurality of output models and the plurality of input models within a predetermined number of steps of each other.

9. The method of claim 8, wherein the output queue is one of a plurality of output queues, and a routing table comprises the plurality of output queues.

10. The method of claim 8, wherein the output queue is hosted on an intermediate peer.

11. The method of claim 8, further comprising, prior to copying the output data from the output queue into the input buffer of the selected input model:

mapping a packet buffer representation of the output data to an input model representation of the output data; and storing offset mappings of the packet buffer representation and the input model representation in the output queue.

12. The method of claim 8, wherein the output queue stores the output data in a plurality of packets, wherein each packet of the plurality of packets comprises a packet queue that organizes the output data according to frames at which the output data is generated.

13. The method of claim 12, further comprising, for each packet of the plurality of packets:

storing the packet's output data in the packet queue until a current frame of the selected input model is higher than an output frame at which a set of output data stored in the packet was generated; and when the current frame is updated to be higher than the output frame of the packet, copying the set of output data from the output queue into the input buffer of the selected input model.

14. The method of claim 8, further comprising:

determining that the selected input model needs the output data as prerequisite data;

determining one or more use frames at which the selected input model needs to use the prerequisite data; and using at least the one or more use frames of the selected input model to determine when to delete the prerequisite data from the output queue.

15. The method of claim 8, wherein the selected input model of the plurality of input models is ready to step the selected frame when prerequisite data is available, wherein the prerequisite data comprises output data generated by the selected output model, the method further comprising:

for the selected input model, determining that the prerequisite data is available; and on condition that the prerequisite data is available for the selected input model, stepping the selected input model.

16. The method of claim 8, further comprising generating deterministic results from the computer simulation environment while running one or more output models of the plurality of output models and one or more input models of the plurality of input models in parallel configurations.

17. The method of claim 8, further comprising operating one or more output models of the plurality of output models (1) in parallel with one or more input models of the plurality of input models and/or (2) asynchronously at different frame rates with respect to the one or more input models of the plurality of input models.

18. A computing system for executing a computer simulation environment that comprises a plurality of output models that produce output data and a plurality of input models that are waiting for a portion of the output data from the plurality of output models, wherein one or more of the models step at a rate of multiple frames per step, the computing system comprising:

a logic subsystem; and a storage subsystem comprising executable instructions that, in response to execution by the logic subsystem, cause the computing system to implement at least:

a scheduler configured to, for each of the input models:

determine if prerequisite data is available, wherein the prerequisite data comprises output data generated by one or more output models of the plurality of output models, on condition that the prerequisite data is available for the input model, step the input model; and maintain the plurality of output models and the plurality of input models within a predetermined number of steps of each other; and a router configured to:

when a selected output model of the plurality of output models finishes a step, copy the output data from an output buffer of the selected output model and send the output data to an output queue, store the output data in the output queue until a selected input model of the plurality of input models is ready to step a selected frame, and when the selected input model of the plurality of input models is ready to step the selected frame, copy the output data from the output queue into an input packet buffer of the selected input model.

19. The computing system of claim 18, wherein the plurality of output models and the plurality of input models are configured to generate deterministic results while running in parallel configurations.

20. The computing system of claim 18, wherein one or more output models of the plurality of output models are configured to operate (1) in parallel with one or more input models of the plurality of input models and/or (2) asynchronously at different frame rates with respect to the one or more input models of the plurality of input models.

*   *   *   *   *